(12) United States Patent
Gaertner et al.

(10) Patent No.: US 9,601,719 B2
(45) Date of Patent: Mar. 21, 2017

(54) LIGHT SOURCE HAVING AN OUTSOURCE DEVICE

(75) Inventors: Georg Friedrich Gaertner, Aachen (DE); Horst Greiner, Aachen (DE); Hans-Peter Loebl, Monschau-Imgenbroich (DE); Gerardus Henricus Rietjens, Stramproy (NL)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 14/240,111

(22) PCT Filed: Aug. 29, 2012

(86) PCT No.: PCT/IB2012/054427
§ 371 (c)(1),
(2), (4) Date: Feb. 21, 2014

(87) PCT Pub. No.: WO2013/030772
PCT Pub. Date: Mar. 7, 2013

(65) Prior Publication Data
US 2014/0217385 A1    Aug. 7, 2014

Related U.S. Application Data

(60) Provisional application No. 61/529,462, filed on Aug. 31, 2011.

(51) Int. Cl.
*H01L 51/52* (2006.01)
*H01L 51/56* (2006.01)
*G02B 5/02* (2006.01)

(52) U.S. Cl.
CPC ........ *H01L 51/5268* (2013.01); *G02B 5/0242* (2013.01); *G02B 5/0278* (2013.01);
(Continued)

(58) Field of Classification Search
USPC ............... 257/40, E51.018; 438/29
See application file for complete search history.

(56) References Cited

U.S. PATENT DOCUMENTS

| 2008/0284320 A1 | 11/2008 | Karkkainen |
| 2009/0302750 A1 | 12/2009 | Jun et al. |

(Continued)

FOREIGN PATENT DOCUMENTS

| CN | 102742352 A | 10/2012 |
| JP | 2007-35313 A | 2/2007 |

(Continued)

OTHER PUBLICATIONS

Van Den Brekel et al., Interface Morphology in Chemical Vapour Deposition on Profiled Substrates, Journal of Crystal Growth, vol. 43, North-Holland Publishing Company, pp. 488-496, 1978.

*Primary Examiner* — Sheng Zhu
(74) *Attorney, Agent, or Firm* — OLEDWorks, LLC (57) ABSTRACT

The invention relates to a light source (1) comprising a light generating unit (2) like an organic light emitting diode and an outcoupling device (3) for coupling light out of the light generating unit in an outcoupling direction (4). The outcoupling device comprises a first region (5) for facing the light generating unit, a second region (7) having a refractive index being smaller than the refractive index of the first region, and a structured intermediate region (6) between the first region and the second region. The first region is optically homogenous and has a thickness in the outcoupling direction being larger than a coherence length of the light, thereby reducing generally possible wavelength dependent interference effects and, thus, a corresponding degradation of the outcoupling efficiency. The outcoupling efficiency can therefore be increased.

9 Claims, 7 Drawing Sheets

(52) U.S. Cl.
CPC .......... *H01L 51/56* (2013.01); *H01L 2251/53* (2013.01); *H01L 2251/56* (2013.01)

(56) References Cited

U.S. PATENT DOCUMENTS

| | | |
|---|---|---|
| 2010/0110551 A1* | 5/2010 | Lamansky et al. ............ 359/599 |
| 2010/0150513 A1* | 6/2010 | Zhang et al. ................. 385/131 |
| 2011/0008602 A1* | 1/2011 | Peeters ......................... 428/220 |
| 2011/0042696 A1 | 2/2011 | Smith et al. |
| 2011/0073897 A1* | 3/2011 | Kang et al. .................... 257/98 |
| 2011/0220936 A1* | 9/2011 | Fujimoto et al. ............... 257/98 |
| 2012/0286258 A1* | 11/2012 | Naraoka et al. ................ 257/40 |

FOREIGN PATENT DOCUMENTS

| | | |
|---|---|---|
| JP | 2008-66027 A | 3/2008 |
| JP | 2008066027 A | 3/2008 |

\* cited by examiner

LIGHT SOURCE HAVING AN OUTSOURCE DEVICE

FIELD OF THE INVENTION

The invention relates to an outcoupling device for coupling light out of a light generating unit, and to a light source comprising the light generating unit and the outcoupling device. The invention relates further to a production method and a production apparatus for producing the outcoupling device.

BACKGROUND OF THE INVENTION

U.S. 2010/0110551 A1 discloses a multifunctional optical film for enhancing light extraction from a self-emissive light source. The multifunctional optical film comprises a flexible substrate, a structured layer of extraction elements having a first index of refraction and a backfill layer comprising a material having a second index of refraction different from the first index of refraction. A substantial portion of the extraction elements is in optical communication with a light emitting region of the self-emissive light source when the optical film is located against the self-emissive light source. The backfill layer forms a planarizing layer over the extraction elements, wherein a difference between an index of refraction of the structured layer and an index of refraction of the backfill layer is greater than or equal to 0.3.

Although the multifunctional optical film enhances the light extraction from a self-emissive light source, the light extraction efficiency is still relatively low.

SUMMARY OF THE INVENTION

It is an object of the present invention to provide an outcoupling device for coupling light out of a light generating unit, wherein the outcoupling efficiency, i.e. the light extraction efficiency, can be increased. It is a further object of the present invention to provide a light source comprising a light generating unit and the outcoupling device, and a production method and a production apparatus for producing the outcoupling device.

In a first aspect of the present invention an outcoupling device for coupling light out of a light generating unit in an outcoupling direction is provided, wherein the outcoupling device comprises:
 a first region for facing the light generating unit, the first region being optically homogenous and having a thickness in the outcoupling direction being larger than a coherence length of the light,
 a second region having a refractive index being smaller than the refractive index of the first region, and
 an intermediate region between the first region and the second region, the intermediate region being structured.

The generated light is generally not perfectly monochromatic, but includes several wavelengths. The several different wavelengths can lead to wavelength dependent interferences of the generated light within the outcoupling device, which reduce the outcoupling efficiency. However, since the optically homogenous first region facing the light generating unit has a thickness in the outcoupling direction being larger than the coherence length of the generated light, these interference effects and, thus, a corresponding degradation of the outcoupling efficiency can be reduced. This and the structured intermediate region increase the outcoupling efficiency.

The first region and the second region are preferentially layers sandwiching the intermediate region, which is preferentially an intermediate layer. The first layer forming the first region is optically homogenous and has a thickness being larger than the coherence length of the generated light. The first layer forming the first region is preferentially regarded as being optically homogenous, if the refractive index and the material composition remain constant over the first layer.

The outcoupling device is adapted to couple the light generated by the light generating unit out of the light generating unit into the second region with the lower refractive index and into air.

In a preferred embodiment the light generating unit is an organic light emitting diode (OLED). In particular, the light generating unit is a white light emitting organic light emitting diode. Correspondingly, the outcoupling device is preferentially adapted to couple light out of an OLED. The OLED is preferentially to be arranged on the first region, in particular, on the first layer, of the outcoupling device for coupling light out of the OLED.

The OLED can generate light having a coherence length in the range of, for example, 3 to 10 µm. The thickness of the first region in the outcoupling direction is therefore, for example, larger than 10 µm.

In an embodiment, the outcoupling device is adapted to couple light out of an OLED, wherein the OLED comprises a cathode layer, an anode layer and several intermediate layers between the cathode layer and the anode layer, wherein the refractive index of the first region is similar to an average of the refractive indices of the intermediate layers. In other words, the refractive index of the first region preferentially matches with the average of the refractive indices of the intermediate layers of the light generating unit.

In an embodiment, the refractive index of the first region is equal to or larger than 1.7. It is further preferred that the refractive index of the first region is equal to or larger than 1.8. In an embodiment, the refractive index of the first region is within the range of 1.7 to 2.1. It has been found that, if the refractive index of the first region is within this range, the outcoupling efficiency can be further increased. For example, the refractive index of the first region can be 1.85±0.05.

In an embodiment, the anode layer and optionally also the cathode layer are transparent for outcoupling light through the anode layer and optionally the cathode layer. The anode layer is, for example, an indium tin oxide (ITO) layer and the cathode layer can be a metal layer. The intermediate layers include preferentially the organic layers of the OLED.

The first material is preferentially an inorganic material being transparent to the generated light. In particular, the first material does not absorb the light generated by the light generating unit. For example, the first region can comprise a first layer being a $SiO_xN_y$ layer. The second region comprises preferentially glass. In particular, the second region can be formed by a glass substrate.

In a preferred embodiment, the structured intermediate region comprises at least one of angularly shaped and roundly shaped structures. For instance, the structures can be pyramidically shaped or hemispherically shaped. Roundly shaped structures can provide a lens effect and can therefore form a lens array.

The second region can comprise second material and the structured intermediate region can comprise structures made of the second material. In particular, the second region can be a second layer having a surface with surface structures forming the structures of the intermediate region. For example, the surface structures can be structures having been produced by sandblasting, grinding and/or etching. In a further preferred embodiment, the intermediate region comprises particles for structuring the intermediate region. The particles can have a refractive index being a) equal to or smaller than the refractive index of the second region or b) equal to or larger than the refractive index of the first region. These different structures in the intermediate region further increase the outcoupling efficiency.

It is further preferred that the outcoupling device is producible by depositing a first material on structures on a surface of a substrate, wherein after the deposition the first region comprises an optically homogenous first layer of the first material having a thickness being larger than the coherence length of the light and having a refractive index being larger than the refractive index of the substrate, the second region comprises a second layer of the substrate and the intermediate region comprises an intermediate layer comprising the structures and the first material. The deposition procedure is preferentially a chemical vapor deposition (CVD) procedure. By performing this deposition procedure the first layer can be well adapted to the structures on the surface of the substrate. In particular, CVD is not a "line-of-sight" process and can coat complex shapes uniformly. It has therefore a good "throwing power".

In a further aspect of the present invention a light source is presented, wherein the light source comprises a light generating unit for generating light and an outcoupling device for coupling light out of the light generating unit as defined in claim 1.

In a further aspect of the present invention a production method for producing an outcoupling device for coupling light out of a light generating unit is presented, wherein the production method comprises:

providing a substrate having structures on a surface of the substrate, providing a first material having a refractive index being larger than the refractive index of the substrate on the surface with the structures such that above the structures an optically homogenous first layer is generated, which has a thickness being larger than the coherence length of the light.

Preferentially, a deposition procedure is performed such that grooves defined by the structures on the surface of the substrate are filled out and the generated first layer above the structures is uniform.

It is further preferred that the first material is provided by a deposition procedure like a CVD procedure. In particular, the deposition is carried out at a CVD number smaller one. This allows effectively filling up groves defined by the structures on the surface of the substrate. After the first material has been provided, a surface of the first layer can be smoothed. For example, a thermal smoothing treatment or a polishing treatment can be carried out for smoothing the first layer. The smoothing treatment of the surface of the first layer, i.e. of the surface facing the light generating unit, further improves the outcoupling efficiency of the outcoupling device.

Preferentially, the production method further comprises providing a light generating unit like an OLED for generating light on the first layer. In particular, an ITO layer is deposited on the first layer and then the further layers of the OLED are provided on the ITO layer for producing a light source comprising an OLED and the outcoupling device.

In a further aspect of the present invention a production apparatus for producing an outcoupling device for coupling light out of a light generating unit is presented, wherein the production apparatus comprises:

a substrate providing unit for providing a substrate having structures on a surface of the substrate, a first material providing unit for providing on the surface with the structures a first material having a refractive index being larger than the refractive index of the substrate such that above the structures an optically homogenous first layer is generated, which has a thickness being larger than the coherence length of the light.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF PREFERRED EMBODIMENTS

Figure 1:
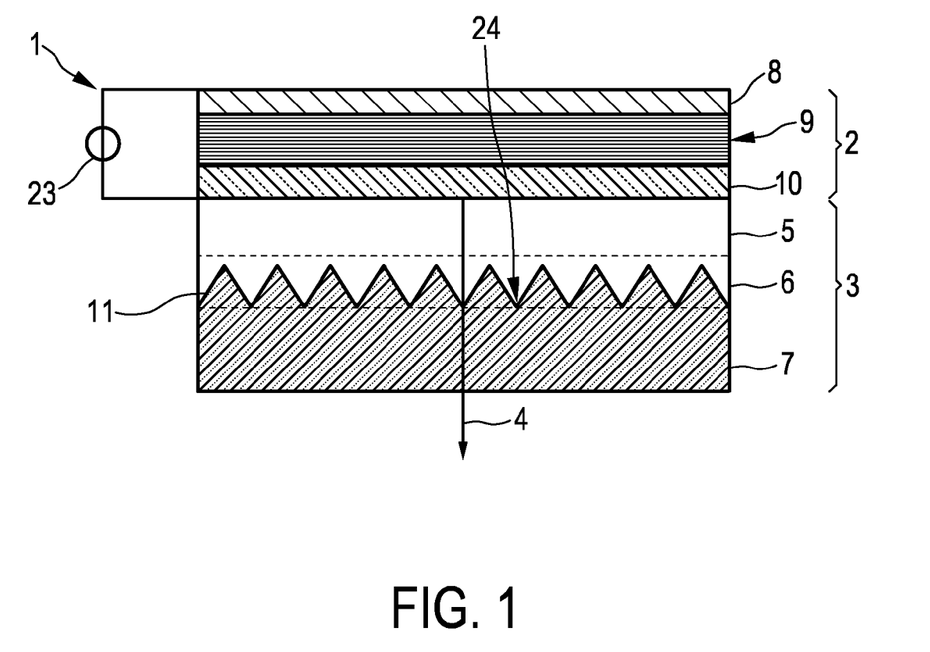
FIGS. 1 to 4 show schematically and exemplarily different embodiments of a light source comprising an outcoupling device.

FIG. 1 shows schematically an example of a light source 1 comprising a light generating unit 2 for generating light and an outcoupling device 3 for coupling the light out of the light generating 2 in an outcoupling direction 4.

The light generating unit 2 is an OLED comprising a cathode layer 8, an anode layer 10 and several intermediate layers 9 between the cathode layer 8 and the anode layer 10. In this embodiment, the cathode layer 8 is a non-transparent metal layer which comprises, for example, copper or silver, and the anode layer 10 is an ITO layer. The intermediate layers 9 can be, for example, two or more layers and include known organic layers which are configured such that light is generated by the intermediate layers 9, if a voltage is applied to the cathode layer 8 and the anode layer 10 via a voltage source 23 schematically shown in FIG. 1. The light generated within the intermediate layers 9 can leave the light generating unit 2 through the anode layer 10 in the outcoupling direction 4. The light source 1 shown in FIG. 1 emits the generated light therefore in the bottom direction. In another embodiment, in addition the cathode layer 8 can be transparent such that the generated light can leave the OLED 2 also through the cathode layer 8. The OLED can therefore be a bottom emitter as shown in FIG. 1, or a bottom and top emitter.

The outcoupling device 3 comprises a first region 5 facing the light generating unit 2, a second region 7 and an intermediate region 6 between the first region 5 and second region 7. The first region 5 is an optically homogenous first layer having a thickness in the outcoupling direction 4 being larger than a coherence length of the generated light. Light generated by an OLED has generally a coherence length between 3 µm and 7 µm. The thickness of the optically homogenous first layer 5, which is uniform and not structured, is therefore preferentially about 10 μm or larger.

The refractive index of the first layer 5 is preferentially similar to an average of the refractive indices of the intermediate layers 9, i.e. the refractive index of the first layer 5 preferentially matches with the average of the refractive indices of the intermediate layers 9 of the light generating unit 2. In this embodiment, the intermediate layers 9 have an average refractive index of about 1.8. The refractive index of the first layer is therefore also about 1.8. In other embodiments, the refractive index of the first layer can have another value, wherein generally the refractive index will be equal to or larger than 1.7. The first layer is preferentially made of an inorganic material being transparent to the light generated by the OLED 2. In particular, the first layer 5 does not absorb the light generated by the OLED 2. In an embodiment, the first layer is made of $SiO_xN_y$.

The second region 7 is a second layer having a refractive index being smaller than the refractive index of the first layer 5. The second layer 7 is preferentially a homogeneous glass substrate. The intermediate region 6 is an intermediate layer being structured by an array of pyramids. In this embodiment, the pyramids have a height of about 1 μm. However, the pyramids can also have another height. Preferentially, if the structures 11 have a larger height, also the total thickness of the intermediate layer 6 and the first layer 5 is larger, in particular, the thickness of the part of the intermediate layer 6 above the structures 11 is larger. For instance, if the structures 11 have a height of, for example, 50 μm, the thickness of the intermediate layer 6 and the first layer 5 together can be about 250 μm. The part of the intermediate layer 6 immediately above the structures 11 comprises curved growth lines, which are caused by depositing the material of the first layer on the structures 11 while producing the outcoupling device 3. These growth lines lead to an optically inhomogeneous part of the intermediate region 6 above the structures 11. With increasing distance to the structures 11 in the height direction the curved growth lines disappear and the deposited first material becomes optically homogenous. This optically homogenous first material above the structures 11 defines the first layer 5.

The pyramid array structure 11 may be prepared by a replica technique and can therefore be prepared in small dimensions of one or only a few micrometers. The structures 11, i.e. the pyramids, are made of the material of the second layer 7. The space between the pyramids 11 is filled up by the first material, which also forms the first layer 5. In FIG. 1, the pyramids are positive with respect to the second layer 7, i.e. pyramids are present on and protrude from the surface 24 of the second layer 7. In another embodiment, the pyramids can also be negative with respect to the second layer 7, i.e. positive pyramids can be formed by filling up negative pyramid holes in the surface of the second layer with the first material, which forms the first layer 5. The pyramids are then not made of the second material having the relatively low refractive index, but by the first material having the relatively large refractive index.

Although in the embodiment described above with reference to FIG. 1 the intermediate layer 6 comprises a pyramid structure 11, in other embodiments the structured intermediate layer 6 can also comprise other structures like other angularly shaped or roundly shaped structures. In the following different structures of intermediate regions will exemplarily be described with reference to FIGS. 2 to 4, wherein in these figures and in FIG. 1 the dimensions are not to scale.

Figure 2:
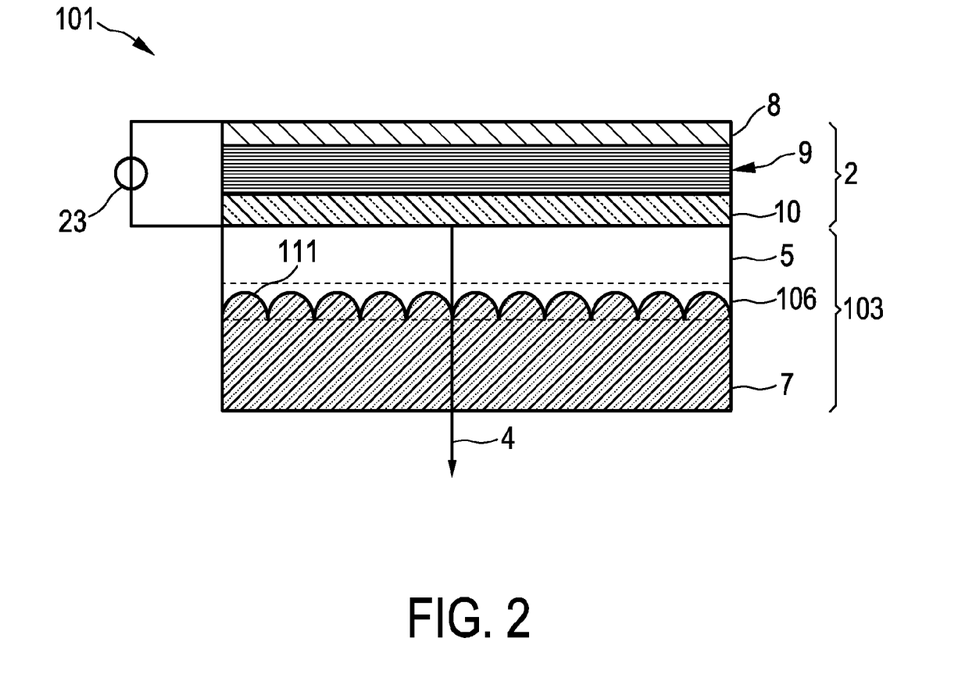

FIG. 2 shows schematically as an example a further embodiment of a light source 101 comprising a light generating unit 2, which is similar to the light generating unit described above with reference to FIG. 1, and an outcoupling device 103, which is similar to the outcoupling device 3 described above with reference to FIG. 1, except for the intermediate layer 106. The intermediate layer 106 comprises hemispherically shaped structures 111 forming a micro lens array. In this embodiment, the hemispheres 111 have a radius of about 5 μm, and the intermediate layer 106 and the first layer 5 together have a thickness within the range of, for example, 30 to 50 μm. Also for preparing the structured surface of the substrate 7 comprising the hemispheres 111 a replica technique can be used.

Figure 3:
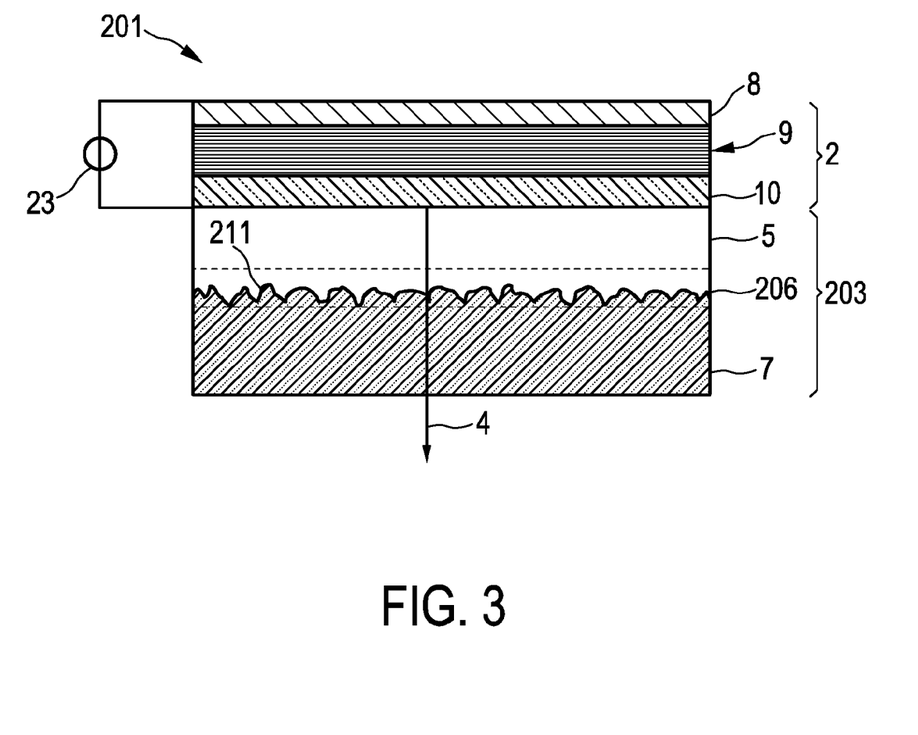

FIG. 3 shows schematically as an example a further embodiment of a light source 201 comprising a light generating unit 2, which is similar to the light generating unit described above with reference to FIG. 1, and an outcoupling device 203. The outcoupling device 203 is similar to the outcoupling device 3 described above with reference to FIG. 1, except for the intermediate layer 206. The intermediate layer 206 comprises random structures 211, which are made of the same material as the second layer 7, wherein the space between the random structures 211 is filled by the first material having the relatively large refractive index. The random structures 211 can be produced by sandblasting the corresponding surface of the substrate 7. In this embodiment, the random structures 211 have a height in the order of several micrometers and the total thickness of the intermediate layer 206 and the first layer 5 is within a range of about 30 to 50 μm.

Figure 4:
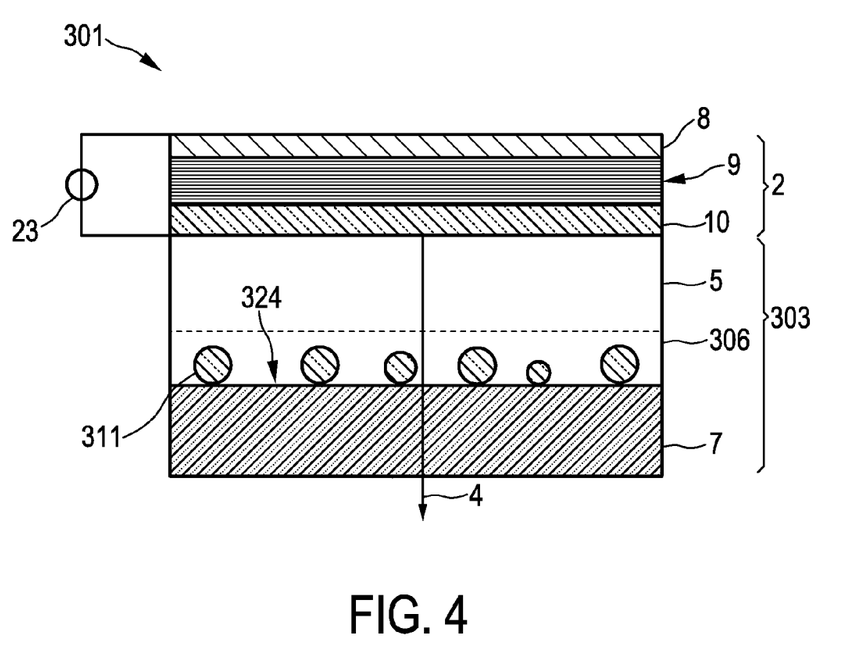

FIG. 4 shows schematically as an example a further embodiment of a light source. The light source 301 comprises a light generating unit 2, which is similar to the light generating unit 2 described above with reference to FIG. 1, and an outcoupling device 303, which is also similar to the outcoupling device 3 described above with reference to FIG. 1, except for the structured intermediate region 306. The intermediate region 306 comprises particles 311 for structuring the intermediate region, i.e. for structuring the intermediate layer 306. The particles 306 can have a refractive index being a) equal to or smaller than the relatively low refractive index of the second layer 7 or b) equal to or larger than the relatively large refractive index of the first layer 5. The particles are distributed, in particular, homogeneously distributed, on the surface 324 of the second layer 7 and are embedded in the first material forming the first layer 5. The diameter of the particles 311 is preferentially larger than 200 nm. The first material is applied to the second layer 7 with the particles 311 by using a deposition technique, which will be described below in more detail.

Figure 5:
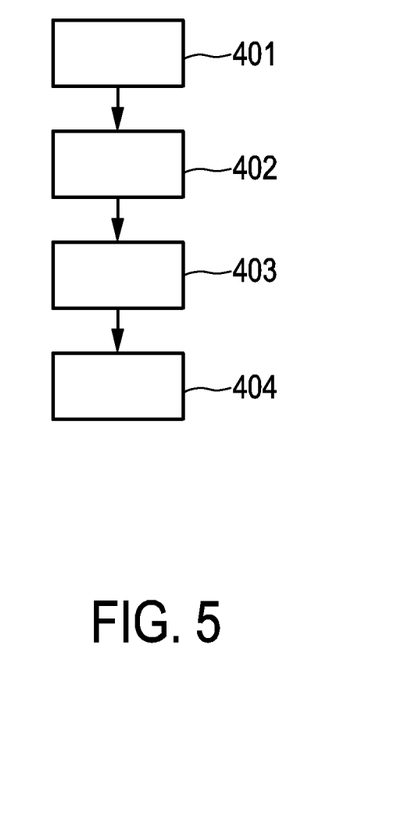
FIG. 5 shows a flowchart exemplarily illustrating an embodiment of a producing method for producing a light source with an outcoupling device.

In the following an example of a production method for producing a light source comprising an outcoupling device will be described with reference to a flowchart shown in FIG. 5.

In step 401, a substrate 7 having structures on a surface of the substrate 7 is provided. In particular, a glass substrate 7 forming the second layer and having structures on a surface of the substrate as shown in FIGS. 1 to 3 can be provided. In another embodiment, a substrate can be provided, which has particles on a flat surface as shown in FIG. 4.

In step 402, a first material having a refractive index being larger than the refractive index of the substrate 7 is deposited on the surface with the structures such that above the structures an optically homogenous first layer is generated. This depositing procedure is preferentially performed by using CVD, in particular with a CVD number smaller one.

The depositing procedure is performed such that the resulting optically homogenous first layer has a thickness being larger than the coherence length of light of a light generating unit which will be provided in step 404.

After the first material has been deposited on the structured surface of the substrate such that the optically homogenous first layer with the relatively large refractive index is generated, in step 403 the surface of the first layer, on which the light generating unit is to be arranged, is smoothed. For example, a thermal smoothing treatment or a polishing treatment can be carried out for smoothing this surface of the first layer.

In step 404, a light generating unit for generating light is provided on the first layer for producing the light source. In particular, an anode layer, which is preferentially an ITO layer, several organic layers and a cathode layer are provided on the first layer by using known procedures for producing an OLED on the first layer. The resulting light source comprises the light generating unit like, for example, an OLED, and an outcoupling device for coupling light out of the OLED, wherein the outcoupling device comprises the substrate with the structures and the first layer. The substrate forms, for example, a second layer 7, the structures with the deposited first material in spaces between the structures form, for instance, an intermediate layer, and the optically homogenous first layer above the structure, which is preferentially uniform, forms, for example, a first layer as shown in FIGS. 1 to 4.

Figure 6:
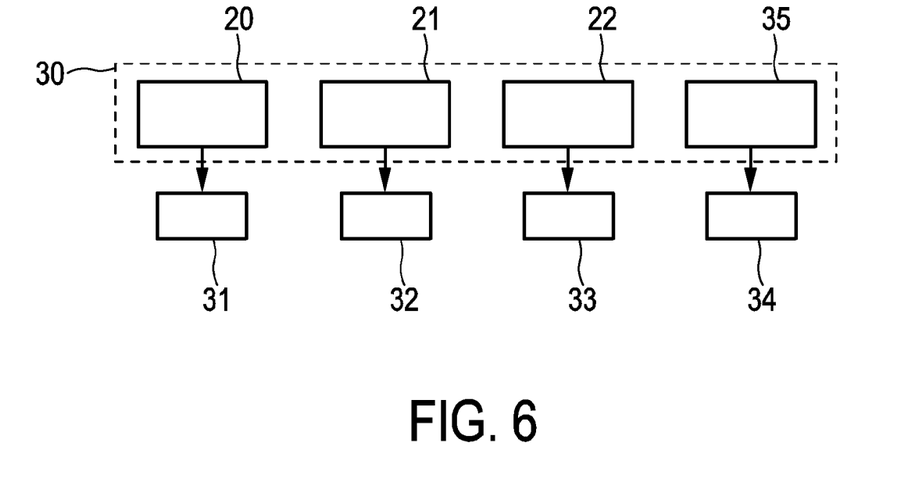
FIG. 6 shows schematically and exemplarily an embodiment of a production apparatus for producing a light source with an outcoupling device.

FIG. 6 shows schematically as an example an embodiment of a production apparatus 30 for producing a light source with an outcoupling device in accordance with the above described production method.

The production apparatus 30 comprises a substrate providing unit 20 for providing a substrate having structures on a surface of the substrate. For example, the substrate providing unit 20 can be adapted to create structures on the substrate, for instance, by sandblasting or by providing particles on a plane surface of the substrate. In FIG. 6, the substrate before creating the structures is denoted by reference number 31 and the substrate with the structures, i.e. after the structures have been created on the surface of the substrate, is denoted by reference number 32.

The production apparatus 30 further comprises a first material providing unit 21 being a depositing unit for depositing a first material, which has a refractive index being larger than the refractive index of the substrate, on the surface with the structures such that above the structures an optically homogenous first layer is generated, which has a thickness being larger than the coherence length of light generated by a light generating unit, which will be provided in a later production step. The resulting substrate 33 with the structures and the optically homogenous first layer is then smoothed, i.e. the surface of the first layer on which the light generating unit will be arranged is smoothed, by a smoothing unit 22. The smoothing unit 22 is adapted to perform, for example, a heating smoothing procedure or a polishing smoothing procedure. For instance, the smoothing procedure can be carried out after depositing the first layer by an additional thermal treatment in an inert, or oxygen or $N_2$, containing atmosphere.

The resulting substrate 34 with the smoothed first layer is then provided with a light generating unit 2 for generating light, in order to produce the light source. The light generating unit is provided by a light generating unit providing unit 35, which can be adapted to, for example, apply the different layers of an OLED on the first layer for producing the light source.

The production method and apparatus can be adapted such that a chemically inert conformal CVD interlayer of a transparent inorganic material is provided on top of a structured or rough interface nanoparticle layer, before an ITO layer is deposited by, for example, Physical Vapor Deposition (PVD) evaporation or sputtering, in particular, electron beam PVD evaporation or sputtering. The chemically inert conformal CVD interlayer forms the first region, i.e. the first layer facing the ITO layer, which has the relatively large refractive index and which has a thickness in the outcoupling direction being larger than the coherence length of the light generated by the OLED.

Preferentially, the CVD parameters are suitably adjusted as described below for providing an interlayer surface as base for the ITO layer, which forms the anode layer of the OLED. The interlayer surface, i.e. the surface of the first layer on which the ITO layer is provided, has a strongly reduced surface roughness compared to the roughness caused by the structures on the surface of the second layer, which is preferentially a glass substrate. The CVD parameters can be adjusted depending on the morphology of the structures such that it is possible to fill up grooves between the structures.

In an embodiment, for providing the first layer, in particular, for filling up of grooves between structures on the second layer, CVD parameters are used as disclosed in the article "Interface Morphology in Chemical Vapour Deposition on Profiled Substrates", by C. v. d. Brekel et al., Journal of Crystal Growth, 43, pages 488 ff. (1978), which is herewith incorporated by reference. In particular, the CVD process is preferentially surface controlled which means that the dimensionless CVD number is preferentially smaller than 1. Moreover, the deposition rates and deposition temperatures are preferentially in the lower range. For example, the deposition rates can be some nanometers per second, for instance, two nanometers per second, and the deposition temperatures can be in the range of 200 to 400° C.

The definition of the CVD number is well known and, for example in the isothermal case, given by the product of the mass transport coefficient $k_D$, with the thickness of the boundary layer in the gas phase $\delta$, divided by the diffusion coefficient $D_T$ in accordance with following equation:

$$N(CVD) = k_D \delta / D_T,$$

wherein N(CVD) denotes the CVD number.

Figure 7:
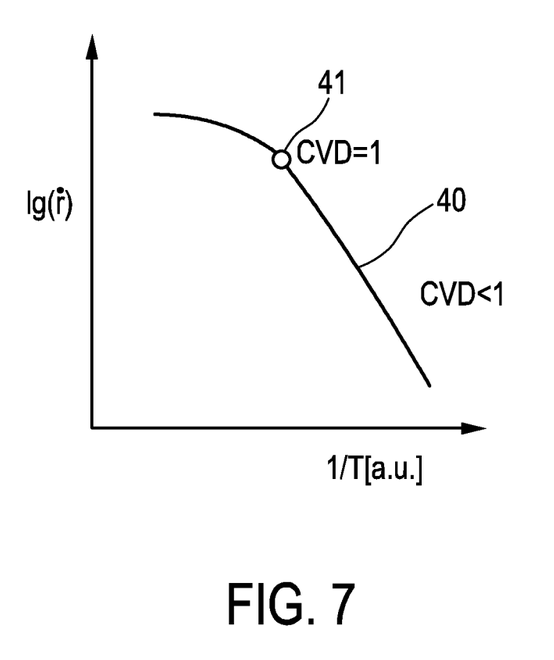
FIG. 7 shows exemplarily a CVD deposition rate depending on an inverse deposition temperature.

FIG. 7 shows exemplarily the logarithm of a CVD deposition rate depending on an inverse deposition temperature in arbitrary units. At the point 41 the CVD number is one. Below this point 41 along the line 40 the CVD number is smaller than one. The deposition temperature is preferentially adjusted such that the deposition procedure corresponds to the line 40 below the point 41. A CVD number being smaller than one defines a kinetically controlled region, in which grooves between the structures can very well be filled up.

In a further embodiment, the CVD parameters are chosen in accordance with the so-called chemical vapour infiltration (CVI) method, in particular, if deeper holes between the structures have to be filled up by the first material. Corresponding CVD parameters are disclosed, for example, in the thesis "Mass transport and morphology in CVD processes" by C. v. d. Brekel, pages 33, 42 and 43, FIGS. 6 and 7, University of Nijmegen (1978), which is herewith incorporated by reference.

The first material for providing the first layer by CVD comprises preferentially oxides, in particular, at least one of the following oxides: $GeO_2$ (1.7), $Ga_2O_3$ (1.77), $HfO_2$ (1.79), $Ta_2O_5$ (2.08), wherein the values in brackets denote the respective refractive index. For example, if the first layer is to be made of $GeO_2$, the CVD reaction can be defined by following chemical equation: $GeCl_4+O_2 \rightarrow GeO_2+2Cl_2$. However, the first material can also comprise a nitride like $Si_3N_4$ (2.05). In an embodiment, the first material, i.e. the first layer made of the first material, comprises only one of the mentioned oxides or only one kind of nitride. Further materials are AlON=AlOxNy (1.71-1.79), YAG (1.82), $Sc_2O_3$ (2.0), Y2O3 (1.93), MgO (1.77) and $Al_2O_3$ (1.66-1.77), if the average OLED index should in the suitable range, or can be adjusted by mixing. The value of n can depend on the preparation conditions. Eventually also a mixture of these oxides/nitrides can be deposited. Compounds with higher refractive indices can be used for embedded/overcoated (eventually also CVD-) particles, such as $Nb_2O_5$ (2.38), $BaTiO_3$ (2.45), $ZrO_2$ (2.2), $TiO_2$ (2.37).

The first layer can also be made by using another transparent oxide or other transparent materials. For example $SiO_xN_y$ can be used, wherein x and y are preferentially chosen such that the refractive index of $SiO_xN_y$ is 1.7 or larger. In an embodiment, x and y are chosen such that the refractive index is 1.85±0.05. The CVD reaction can then be defined by following chemical equation: $SiCl_4+x/2\ O_2+y/2\ N_2 \rightarrow SiO_xN_y+2\ Cl_2$.

For performing the CVD of the above-mentioned materials $GeO_2$, $Ga_2O_3$, $HfO_2$, $Ta_2O_5$, $Si_3N_4$, sufficiently volatile starting compounds are needed. In the sequence of the above materials these requirements are mostly fulfilled by the respective halides, namely $GeCl_4$, $GaCl_3$, $HfCl_4$, $TaF_5$ or $TaCl_5$, $SiF_4$ or $SiCl_4$. Thus, for example, one of the above-mentioned materials is preferentially used with one of the mentioned halides for performing the CVD procedure.

In an embodiment, thermal CVD up to a temperature of 600° C. is used, in particular, if the substrate forming the second layer, i.e. the second region, is boron silicate glass. In another embodiment, plasma assisted CVD can be used, in particular, if due to specific deposition conditions including the volatility of the starting compound either thermal CVD would need higher temperatures or if the base temperature should be lowered to, for example, 400° C. for other reasons such as other glass compositions used as a substrate, which are not stable above this temperature. The plasma assisted CVD can be a microwave plasma activated CVD, which can be performed at a pressure of, for example, between 0.08 and 0.33 mbar.

In an embodiment, the CVD process in accordance with the above-mentioned chemical reaction equation for depositing $SiO_xN_y$ is a plasma activated CVD process, which uses, for example, a remote plasma arrangement. For example, this plasma activated CVD for depositing $SiO_xN_y$ can be performed at a temperature between 80 and 600° C.

In other embodiments other Si precursors can be used for depositing the $SiO_xN_y$ layer as the first layer on the substrate with the structures, wherein preferentially a relatively low temperature smaller than, for example, 800° C. and optionally a relatively low pressure being lower than, for example, 0.4 mbar can be used.

In an embodiment, a CVD process for $SiO_xN_y$ deposition can be applied, which uses $SiH_4$, $NH_3$, and $O_2$ or $N_2O$ as gaseous starting compounds, diluted in $N_2$, as described in the Article "Rapid Thermal Chemical Vapour Deposition of $SiO_xN_y$ Films" by F. Lebland et al., Applied Surface Science, volume 54, pages 125 to 129 (1992). By using $N_2O$ the refractive index can be continuously varied between 1.46 and 2.2 by adjusting the relative amounts, i.e. gas flows, of $N_2O$ and $NH_3$ in a one step process. In particular, the relative amounts of $N_2O$ and $NH_3$ can be adjusted such that the refractive index is larger than 1.7, in particular, equal to about 1.8. The relative amounts of $N_2O$ and $NH_3$ can be determined by, for example, experimentation, wherein different layers are deposited by using different relative amounts and wherein the refractive index of the different layers is measured, or by calculation. Alternatively, $SiO_xN_y$ can be replaced by $SiAl_xO_y$ or AlON whereby the refractive index of $SiAl_xO_y$ can be changed by a transition to $Al_2O_3$ and the refractive index of AlON can be changed by a transition to $SiAl_xO_yN_z$.

Although in the above described embodiments the light generating unit is an OLED, the light generating unit can also be another kind of light generating means. For instance, the light generating unit can also be an inorganic light emitting diode, or the light generating unit can be another light generating unit comprising a region with a relatively high refractive index, which is, for example, larger than 1.7, wherein in this high refractive index region light is generated, which can be outcoupled by the outcoupling device.

Although in the above described embodiments the first layer has been deposited by using a CVD, in other embodiments also other methods can be used for producing the outcoupling device having the first region, the second region and an intermediate region between the first and second regions. For example, other deposition methods or sputtering methods can be used. For example, a laser ablation deposition method, a glass melting deposition method or a sol-gel deposition method can be used.

Although in the above described embodiments the OLED and, thus, the outcoupling device have a planar form, i.e. although in the above described embodiments they comprise planar layers, the OLED and the outcoupling device can also have a three-dimensional curved form, wherein the layers of the OLED and the outcoupling device can be three-dimensionally curved.

Although in the above described embodiments the outcoupling device comprises certain layers, in particular, an optically homogenous first layer having a thickness in the outcoupling direction being larger than a coherence length of the light to be outcoupled, a second layer having a refractive index being smaller than the refractive index of the first layer, and an intermediate region between the first layer and the second layer, wherein the intermediate region is structured, in other embodiments the outcoupling device can further comprise additional layers, which may further enhance the outcoupling efficiency.

Although in the embodiments described above with reference to FIGS. 1 to 4 the outcoupling device is optically connected with the light generating unit, in other embodiments the outcoupling device can also be a separate device, which may already comprise an anode layer, in particular, an ITO layer, on the first layer, wherein this separate outcoupling device can be provided to an OLED producer, which provides the OLED layers on the outcoupling device for producing a light source comprising the OLED and the outcoupling device.

Although above in an example the second region comprises boron silicate glass, the second region can also comprise another material, for instance, another glass substrate like a soda-lime glass substrate.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Method steps for producing the outcoupling device, in particular, for producing the OLED with the outcoupling device, performed by one or several units or devices can be performed by any other number of units or devices. For example, steps 402 and 404 can be performed by a single unit or by any other number of different units.

Any reference signs in the claims should not be construed as limiting the scope.

The invention claimed is:

1. A light source comprising: a light generating unit for generating light, and an outcoupling device for coupling light out of the light generating unit in an outcoupling direction, wherein the outcoupling device comprises: a first region for facing the light generating unit, the first region being optically homogenous and having a thickness in the outcoupling direction being larger than 10 pm, a second region having a refractive index being smaller than the refractive index of the first region, and an intermediate region between the first region and the second region, the intermediate region being structured, wherein the intermediate region comprises particles for structuring the intermediate region, the particles having a refractive index being equal to or smaller than the refractive index of the second region or larger than the refractive index of the first region; and wherein the particles are distributed on and attached to the surface of the second region.

2. The light source as defined in claim 1, wherein the light generating unit is a white light emitting organic light emitting diode comprising a cathode layer, an anode layer and several intermediate layers between the cathode layer and the anode layer.

3. The light source as defined in claim 1, wherein the refractive index of the first region is equal to or larger than 1.7.

4. The light source as defined in claim 1, wherein the first region comprises a first layer being a $SiO_xN_y$ layer.

5. The light source as defined in claim 1, wherein the outcoupling device is producible by depositing a first material on structures on a surface of a substrate, wherein after the deposition the first region comprises an optically homogenous first layer of the first material having a thickness in the outcoupling direction being larger than 10 μm and having a refractive index larger than the refractive index of the substrate, the second region comprises a second layer of the substrate and the intermediate region comprises an intermediate layer comprising the structures and the first material, the structures comprising particles having a refractive index being equal to or smaller than the refractive index of the second region or larger than the refractive index of the first region; and wherein the particles are distributed on and attached to the surface of the second region.

6. The light source as defined in claim 2 wherein the refractive index of the first region matches the average of the refractive indices of the intermediate layers of the light generating unit.

7. The light source as defined in claim 1 where the second region is a second layer and the particles of the intermediate region are homogenously distributed on the surface of the second layer and covered by the first region.

8. The light source as defined in claim 1 where the material in the optically homogenous first region is an inorganic material that is transparent to the generated light.

9. The light source as defined in claim 1 wherein the second region comprises glass.

* * * * *